(12) United States Patent
Dunbar et al.

(10) Patent No.: US 7,076,997 B2
(45) Date of Patent: Jul. 18, 2006

(54) APPARATUS FOR TESTING AUTOMATIC TRANSMISSION SOLENOID VALVES

(75) Inventors: Stephen Dunbar, Fairborn, OH (US); Eric Ellington, Marysville, OH (US)

(73) Assignee: Honda Motor Co., Ltd., Tokyp (JP)

( * ) Notice: Subject to any disclaimer, the term of this patent is extended or adjusted under 35 U.S.C. 154(b) by 253 days.

(21) Appl. No.: 10/844,111

(22) Filed: May 12, 2004

(65) Prior Publication Data

US 2005/0252287 A1    Nov. 17, 2005

(51) Int. Cl.
*G01M 15/00* (2006.01)
(52) U.S. Cl. .................................................. 73/118.1
(58) Field of Classification Search ............... 73/118.1, 73/168, 162, 117.2
See application file for complete search history.

(56) References Cited

U.S. PATENT DOCUMENTS

| | | |
|---|---|---|
| 4,939,928 A | 7/1990 | Carle et al. |
| 5,060,177 A | 10/1991 | Gregory et al. |
| 5,129,259 A | 7/1992 | View et al. |
| 5,467,644 A | 11/1995 | Schaffer |
| 5,515,272 A | 5/1996 | Sakai et al. |
| 5,558,311 A | 9/1996 | Connolly et al. |
| 5,712,420 A | 1/1998 | Schaffer |
| 5,712,434 A | 1/1998 | Sylvis |
| 5,784,245 A | 7/1998 | Moraghan et al. |
| 5,847,274 A | 12/1998 | Schaffer |
| 5,915,667 A | 6/1999 | Kim et al. |
| 5,957,260 A | 9/1999 | Kunii |
| 6,038,918 A | 3/2000 | Newton |
| 6,050,542 A | 4/2000 | Johnson et al. |
| 6,068,237 A | 5/2000 | Holmes et al. |
| 6,102,176 A | 8/2000 | Fujikawa |
| 6,367,766 B1 | 4/2002 | Briant et al. |
| 6,470,763 B1 | 10/2002 | Ohashi et al. |
| 6,692,388 B1 | 2/2004 | Nirasawa et al. |

*Primary Examiner*—Robert Raevis
(74) *Attorney, Agent, or Firm*—Rankin, Hill, Porter & Clark LLP; Mark E. Duell

(57) ABSTRACT

The present invention is directed to an apparatus for testing a plurality of on/off solenoid valves and a plurality of proportional solenoid valves of an automotive transmission. The apparatus includes an on/off valve switch for each of the on/off solenoid valves and a series of preset current switches for each of the proportional solenoid valves. An on/off solenoid circuit is electrically connected to the on/off valve switches and includes a plurality of outputs for connection to the on/off solenoid valves. In response to actuation of the on/off valve switches, the on/off solenoid circuit is operable to generate electrical actuation signals for transmission through the outputs to the on/off solenoid valves, respectively. Proportional solenoid circuits are electrically connected to the series of the preset current switches, respectively. Each proportional solenoid circuit has an output for connection to one of the proportional solenoid valves. Each proportional solenoid circuit is operable in response to selective actuation of the associated series of preset current switches to generate and transmit electrical preset current signals to one of the proportional solenoid valves through the output, wherein said preset current signals have different preset current levels.

25 Claims, 6 Drawing Sheets

APPARATUS FOR TESTING AUTOMATIC TRANSMISSION SOLENOID VALVES

BACKGROUND OF THE INVENTION

The present invention is directed toward automotive transmission testing and, more particularly, toward an apparatus for testing on/off solenoid valves and proportional or linear solenoid valves of an automotive transmission.

An automatic transmission for an automotive vehicle automatically shifts gears based on certain operating conditions, such as crankshaft speed, accelerator pedal depression, vehicle speed, etc. The shifting of gears is performed by clutches which are actuated by pressurized hydraulic fluid. The supply of hydraulic fluid to the clutches is controlled and regulated by hydraulic circuits that include a number of control devices, such as on-off solenoid valves and proportional solenoid valves. Solenoid valves are electro-mechanical devices that utilize a solenoid to control valve activation. As is well known, a solenoid comprises a coil of wire that is wound around a movable plunger or armature that is at least partially ferromagnetic. When a given amount of current passes through the coil, the coil generates a magnetic field that moves the armature, thereby moving a seat that opens and closes the valve. In an on-off solenoid, the seat may be disposed in only two positions, namely a fully open position and a fully closed position, whereas in a proportional solenoid valve, the seat may disposed in intermediate positions between a fully open position and a fully closed position. In a proportional solenoid, the amount of movement of the armature and, thus, the position of the seat is dependent on the amount of current flowing through the coil. More specifically, the position of the seat is proportionally related to the current.

In automotive transmissions, an on-off solenoid valve is used to either selectively close a hydraulic circuit to produce a maximum pressure therein, or to open a hydraulic circuit to produce a minimum pressure therein. The engagement and disengagement of a clutch to shift between gears is typically accomplished by moving between maximum and minimum pressures in a hydraulic circuit through the activation and deactivation of on-off solenoid valves. Such on-off solenoid valves are typically referred to as shift solenoid valves. Shift solenoid valves are typically actuated by electrical signals having a voltage in a range between 5 and 18 volts direct current.

In automotive transmissions, a proportional solenoid valve is used to vary the fluid pressure in a hydraulic circuit. The engagement and disengagement of a start clutch, which controls motive power transmission when a vehicle is started or stopped, is often controlled by varying fluid (oil) pressure in a hydraulic circuit using proportional solenoid valves. Proportional solenoid valves may also be used for shift control and for PH-PL control (pressure high—pressure low). Such proportional solenoid valves are typically controlled by electrical signals having a current varying between 0 and 2 amps.

In an automotive transmission, solenoid valves are typically mounted to a transmission valve body that includes worm trails and passages through which hydraulic fluid is routed. The transmission valve body and the solenoid valves are disposed inside a transmission case.

Since defects in the solenoid valve and associated hydraulic circuits will cause an automatic transmission to malfunction, it is important to verify that all solenoid valves and associated hydraulic circuits are operating properly before they are installed in a transmission during the assembly of the transmission. It is also important to be able to identify a defective solenoid and/or associated hydraulic circuit when repairing a malfunctioning transmission. Accordingly, devices for testing automatic transmissions and automatic transmission solenoid valves have been developed. Many of these devices are operable only to test shift solenoid valves. Some of these devices, however, can test both a shift solenoid and a proportional solenoid. For example, U.S. Pat. No. 5,712,434 to Sylvis and U.S. Pat. No. 6,038,918 to Newton each disclose a testing device that can test both a shift solenoid and a proportional solenoid. Each device, however, can only test one shift solenoid or one proportional solenoid at a time. Moreover, in each device, a proportional solenoid is tested by varying the current supplied to coil of the proportional solenoid by manipulating a potentiometer knob. Thus, when testing a plurality of proportional solenoid valves, a considerable amount of time is wasted adjusting the potentiometer knob to produce the various test current levels. Moreover, many of these knob-type potentiometers are not smooth, which can lead to inaccuracies.

Based on the foregoing, there exists a need in the art for an improved test apparatus for testing shift solenoid valves and proportional solenoid valves of an automatic transmission. The present invention is directed to such a test apparatus.

SUMMARY OF THE INVENTION

In accordance with the present invention, an apparatus is provided for testing a proportional or linear solenoid valve of an automotive transmission. The apparatus includes a plurality of preset current switches and a proportional solenoid circuit electrically connected to the preset current switches and having an output for connection to the proportional solenoid valve. The proportional solenoid circuit is operable in response to selective actuation of the preset current switches to generate and transmit electrical preset current signals to the proportional solenoid valve through the output, respectively. The preset current signals have different preset current levels.

In accordance with another aspect of the present invention, a variable current switch is electrically connected to the proportional solenoid circuit and a potentiometer is provided for manipulation by an operator. The potentiometer is electrically connected to the proportional solenoid circuit. The proportional solenoid circuit is operable in response to actuation of the variable current switch to generate and transmit an electrical variable current signal to the proportional solenoid valve through the output. The electrical variable current signal has a current level chosen by operator manipulation of the potentiometer.

In accordance with still another aspect of the present invention, the apparatus is also operable to test an on/off solenoid valve of an automotive transmission. An on/off solenoid circuit is provided and is electrically connected to an on/off valve switch. The on/off solenoid circuit includes an output for connection to the on/off solenoid valve. The on/off solenoid circuit is operable to generate an electrical actuation signal for transmission through the output to the on/off solenoid valve in response to actuation of the on/off valve switch.

Advantageously, the apparatus of the present invention may, in accordance with another aspect of the present invention, be operable to test a plurality of on/off solenoid valves and a plurality of proportional solenoid valves.

BRIEF DESCRIPTION OF THE DRAWINGS

The features, aspects, and advantages of the present invention will become better understood with regard to the following description, appended claims, and accompanying drawings where:

DETAILED DESCRIPTION OF THE PREFERRED EMBODIMENTS

Figure 1:
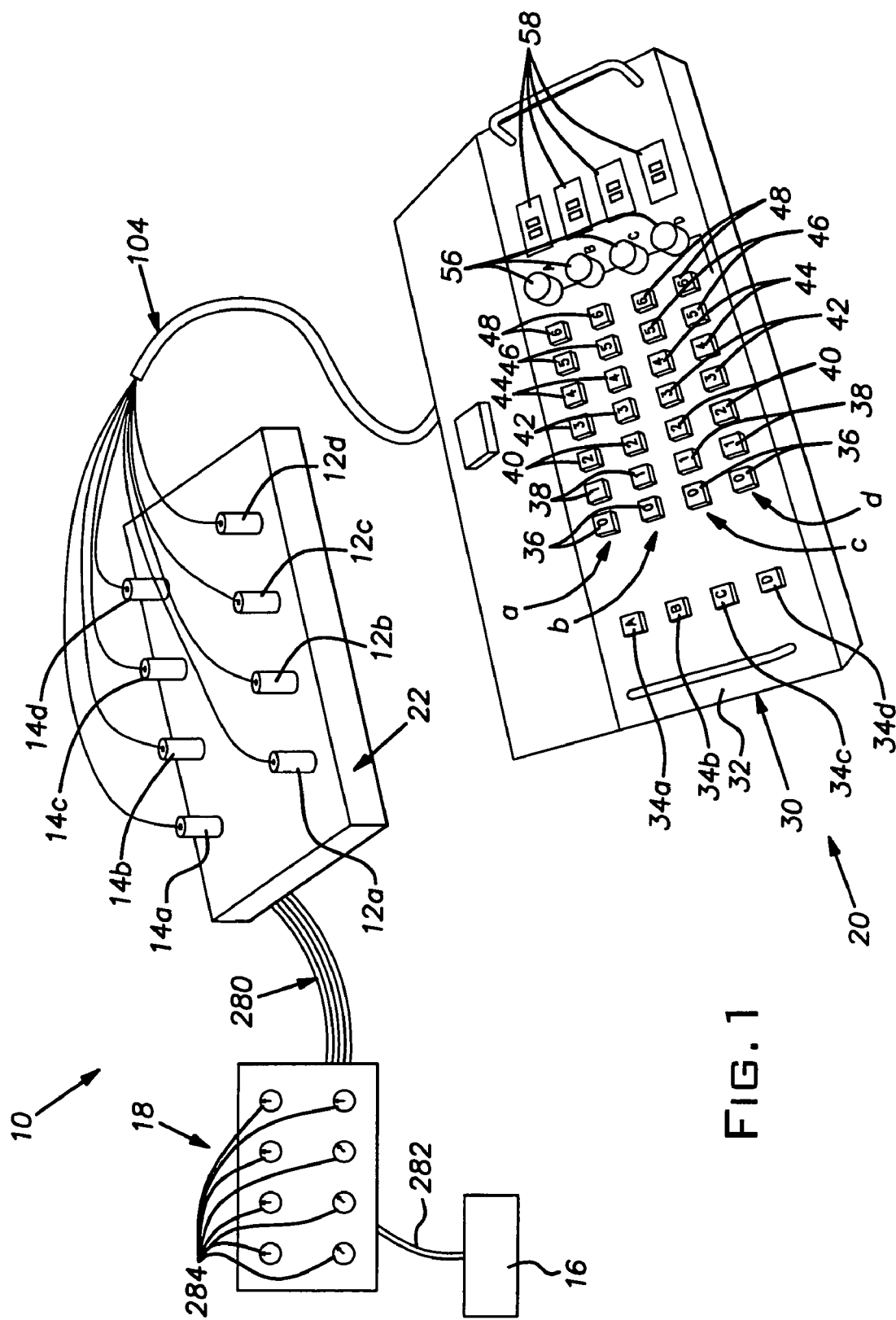
FIG. 1 is a schematic view of a test assembly for testing shift solenoid valves and proportional or linear solenoid valves of an automatic transmission.

It should be noted that in the detailed description that follows, identical components have the same reference numerals, regardless of whether they are shown in different embodiments of the present invention. It should also be noted that in order to clearly and concisely disclose the present invention, the drawings may not necessarily be to scale and certain features of the invention may be shown in somewhat schematic form.

Referring now to FIG. 1, there is shown a test assembly 10 for testing four shift solenoid valves 12a,b,c,d and four proportional solenoid valves 14a,b,c,d. It is noted that the proportional solenoid valves are sometimes referred to as linear solenoid valves in the art. The shift solenoid valves 12a–d are on/off solenoid valves, each having an armature movable between open and closed positions. The test assembly 10 includes a hydraulic fluid source 16, a valve test stand 18 and a solenoid control module 20. The shift solenoid valves 12a–d and proportional solenoid valves 14a–d may be mounted to a transmission valve body 22. The valve test stand 18, the transmission valve body 22, the shift solenoid valves 12a–d and the proportional solenoid valves 14a–d are shown in a highly schematic manner.

The solenoid control module 20 includes a power management circuit comprising a shift solenoid circuit 24 (FIGS. 3A–3B) for testing shift solenoid valves 12a–d and four proportional solenoid circuits 26 (FIGS. 4–5) for testing proportional solenoid valves 14a–d, respectively. The power management circuit further comprises a step-down transformer 28 (FIG. 3A), which is for connection to a 120 VAC power source and which is operable to drop the incoming voltage to 18 VAC. The shift solenoid circuit 24 and the proportional solenoid circuits 26 are provided on circuit boards, respectively. In the description that follows, only the proportional solenoid circuit 26 for the proportional solenoid valve 14a is shown (in FIGS. 4 and 5), it being understood that the proportional solenoid circuits 26 for proportional solenoid 14b–d are substantially the same as the proportional solenoid circuit 26 for the proportional solenoid valve 14a.

The power management circuit is mounted inside a housing 30 having a front panel 32 with a plurality of operator interface devices mounted thereto. The operator interface devices include a vertical row of four shift solenoid pushbuttons 34a,b,c,d and four horizontal rows a, b, c, d of seven proportional solenoid pushbuttons 36, 38, 40, 42, 44, 46, 48 each. The shift solenoid pushbuttons 34a–d are latching pushbuttons, while the proportional solenoid pushbuttons 36–48 are momentary pushbuttons. At the end of each row a, b, c, or d of the proportional solenoid pushbuttons 36–48, a potentiometer 56 and a digital display 58 are mounted to the front panel 32. The shift solenoid pushbuttons 34a–d are connected into the shift solenoid circuit 24, while the four rows a–d of proportional solenoid pushbuttons 36–48 are connected into the four proportional solenoid circuits 26, respectively. Each of the shift solenoid pushbuttons 34a–d and the proportional solenoid pushbuttons 36–48 becomes illuminated upon actuation. The shift solenoid pushbuttons 34a–d control the provision of electrical signals to shift solenoid valves 12a–d, respectively, whereas the rows a–d of the proportional solenoid pushbuttons 36–48 control the provision of electrical signals to the proportional solenoid valves 14a–d, respectively. Each row a, b, c or d of the proportional solenoid pushbuttons 36–48 is dedicated to providing an electrical signal with a selected current level to one of the proportional solenoid valves 14a, b, c, or d. In each row a, b, c, or d of the proportional solenoid pushbuttons 36–48, the proportional solenoid pushbuttons 36–46 are for providing different preset currents for the signal to a proportional solenoid valve 14a, b, c or d, while the proportional solenoid pushbutton 48 is for providing a variable current for the signal to the proportional solenoid 14 a, b, c or d. The potentiometer 56 at the end of each row a, b, c or d is operable to select the variable current for the proportional solenoid pushbutton 48. The display 58 at the end of each row a, b, c or d displays the actual current drawn by the proportional solenoid 14a, b, c or d associated with the row a, b, c or d.

Figure 2:
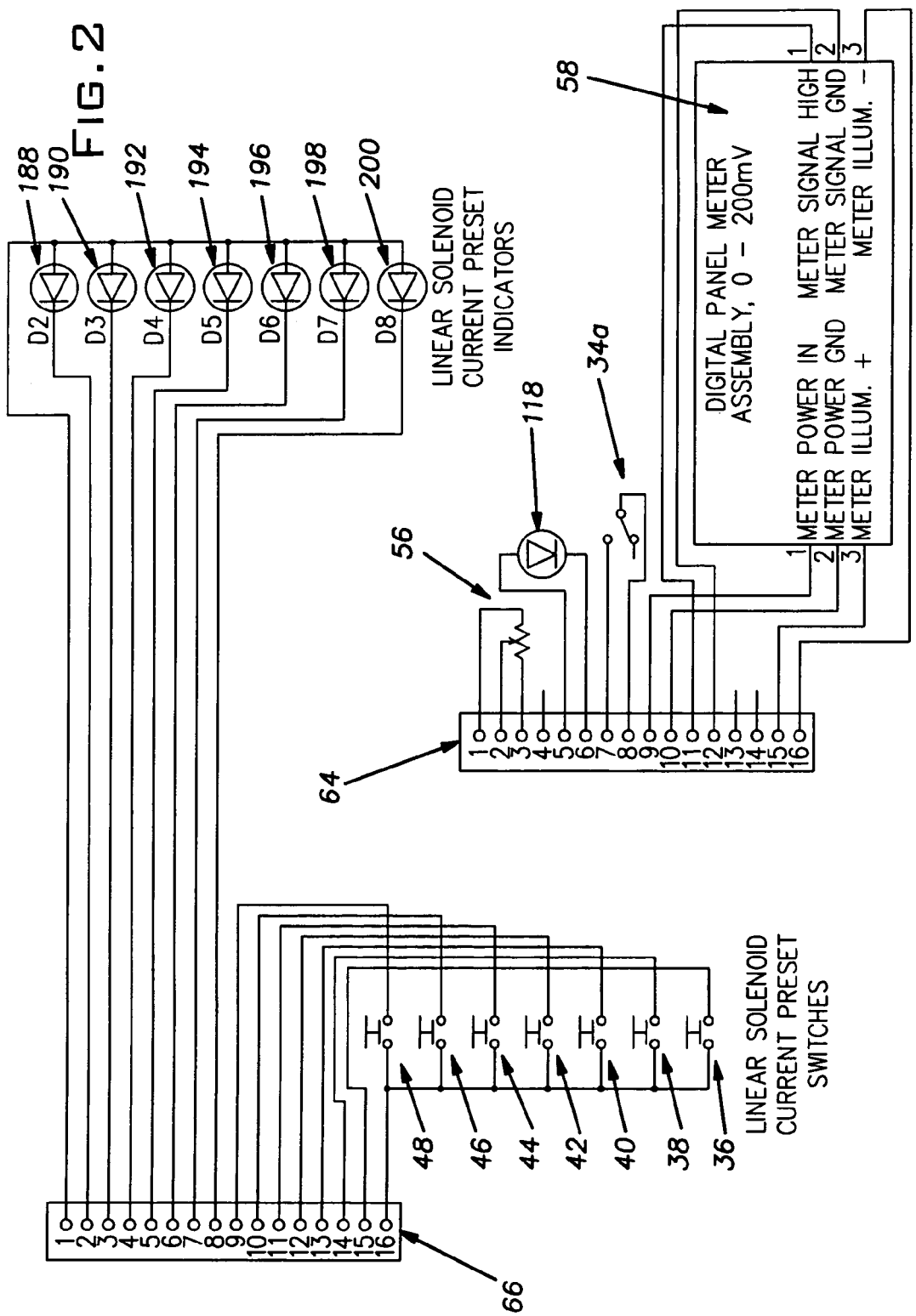
FIG. 2 shows a circuit diagram of connections to operator interface devices on a front panel of a solenoid control module of the test assembly.

Four panel terminal strips 64 and four panel terminal strips 66 are provided on the rear of the front panel 32. Each panel terminal strip 64 is provided for a shift solenoid 12a,b,c or d and a proportional solenoid 14a,b,c or d, while each panel terminal strip 66 is for a proportional solenoid 14a,b,c or d. For purposes of brevity, only the panel terminal strips 64, 66 for the shift solenoid valve 12a and the proportional solenoid valve 14a are shown in FIG. 2, it being understood that panel terminal strips 64, 66 for the shift solenoid valves 12b–d and the proportional solenoid valves 14b–d are substantially the same as the panel terminal strips 64, 66 for the shift solenoid valve 12a and the proportional solenoid valve 14a.

Figure 3A:
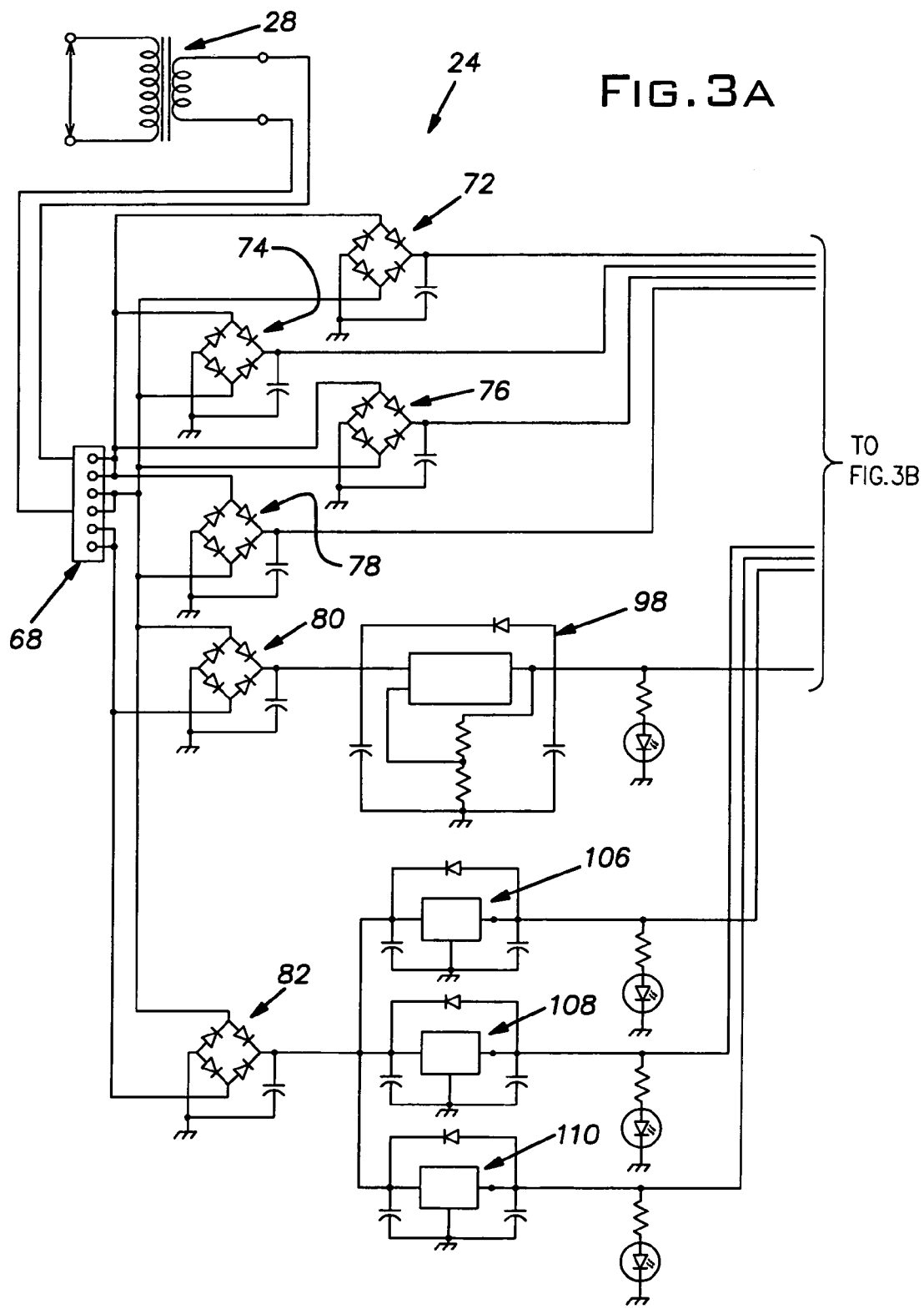
FIG. 3A shows a diagram of a first portion of a shift solenoid circuit of the solenoid control module.
Figure 3B:
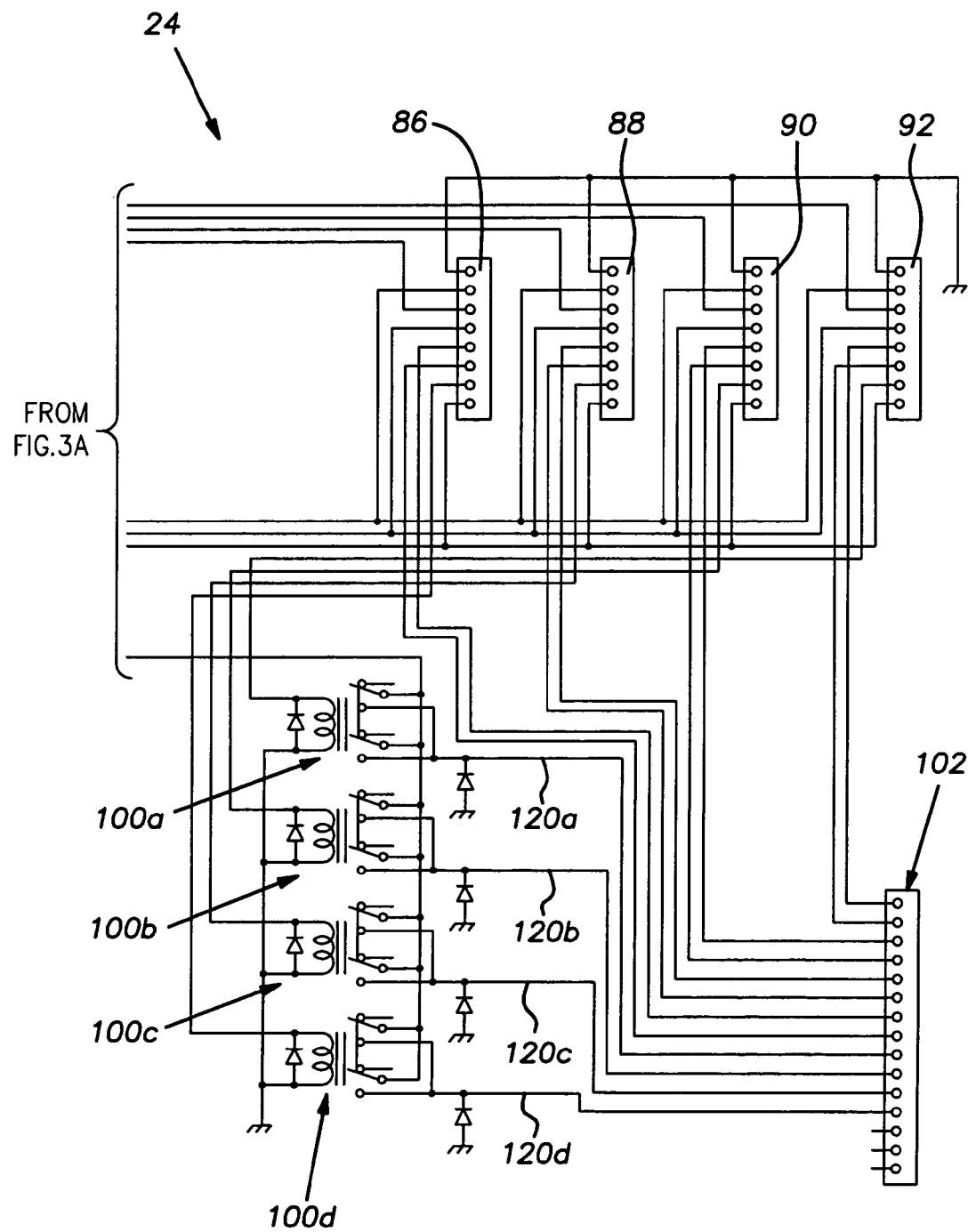
FIG. 3B shows a diagram of a second portion of the shift solenoid circuit of the solenoid control module.

With reference now to FIGS. 3A and 3B, the shift solenoid circuit 24 includes a terminal strip 68 that is connected to the transformer 28 to receive 18 VAC power therefrom. The terminal strip 68 has output terminals connected to four 3 amp bridge rectifiers 72, 74, 76, 78 with capacitor filters and two 5 amp bridge rectifiers 80, 82 with capacitor filters. The bridge rectifiers 72–82 are operable to convert the 18 VAC output from the transformer 28 to 18 VDC outputs. The filtered 18 VDC outputs from the bridge rectifiers 72–78 are provided to terminal strips 86, 88, 90, 92, which are respectively connected to terminal strips 96 in the proportional solenoid circuits 26 (FIG. 4) by cables (not shown).

The 18 VDC filtered output of the bridge rectifier 80 is provided to a voltage regulator 98 (FIG. 3A) which drops and regulates the 18 VDC so as to produce a regulated 12 VDC output. The regulated 12 VDC output from the voltage regulator 98 is provided to contacts on relays 100a,b,c,d (FIG. 3B), which are preferably 16 amp miniature relays with 12 VDC coils. The contacts on relays 100a–d are connected to an output terminal strip 102 which is connected by a wiring harness 104 (shown in FIG. 1) to the shift solenoid valves 12a–d and the proportional solenoid valves 14a–d at the valve test stand 18. The 18 VDC filtered output of the bridge rectifier 82 is provided to voltage regulators 106, 108, 110 (FIG. 3A). The voltage regulators 106, 108 drop and regulate the 18 VDC so as to have regulated 12 VDC outputs, while the voltage regulator 110 drops and regulates the 18 VDC so as to have a regulated 5 VDC output. The regulated 12 VDC outputs of the voltage regulators 106, 108 and the regulated 5 VDC output of the voltage regulator 110 are provided to each of the terminal strips 86, 88, 90, 92. The regulated 12 VDC output from the voltage regulator 106 is provided to fans (not shown) mounted inside the housing 30, the regulated 12 VDC output from the voltage regulator 108 is provided to the proportional solenoid circuits 26, and the regulated 5 VDC outputs from the voltage regulator 110 is provided to the digital displays 58 mounted to the front panel 32.

Figure 4:
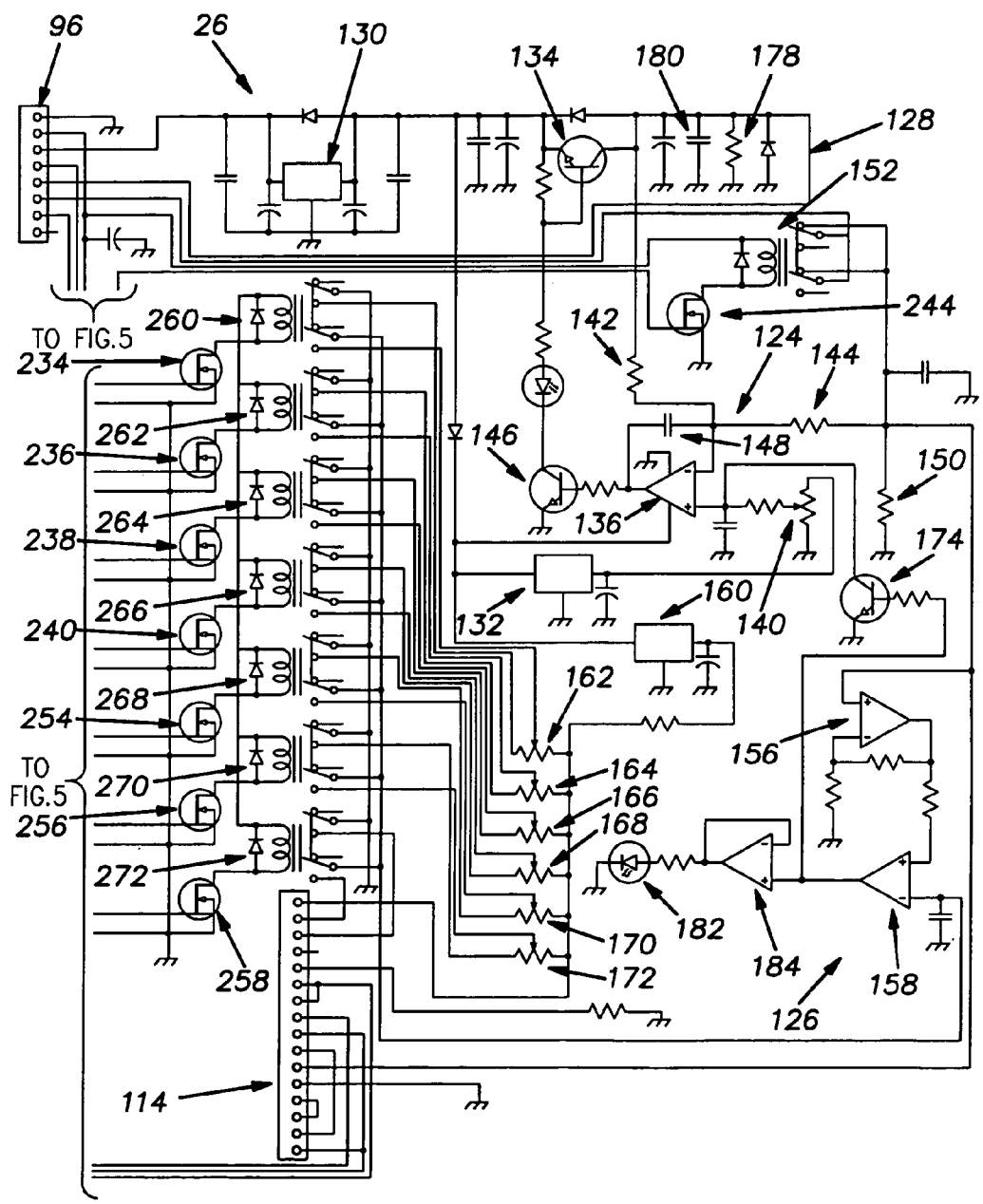
FIG. 4 shows a diagram of a first portion of a proportional solenoid circuit of the solenoid control module.
Figure 5:
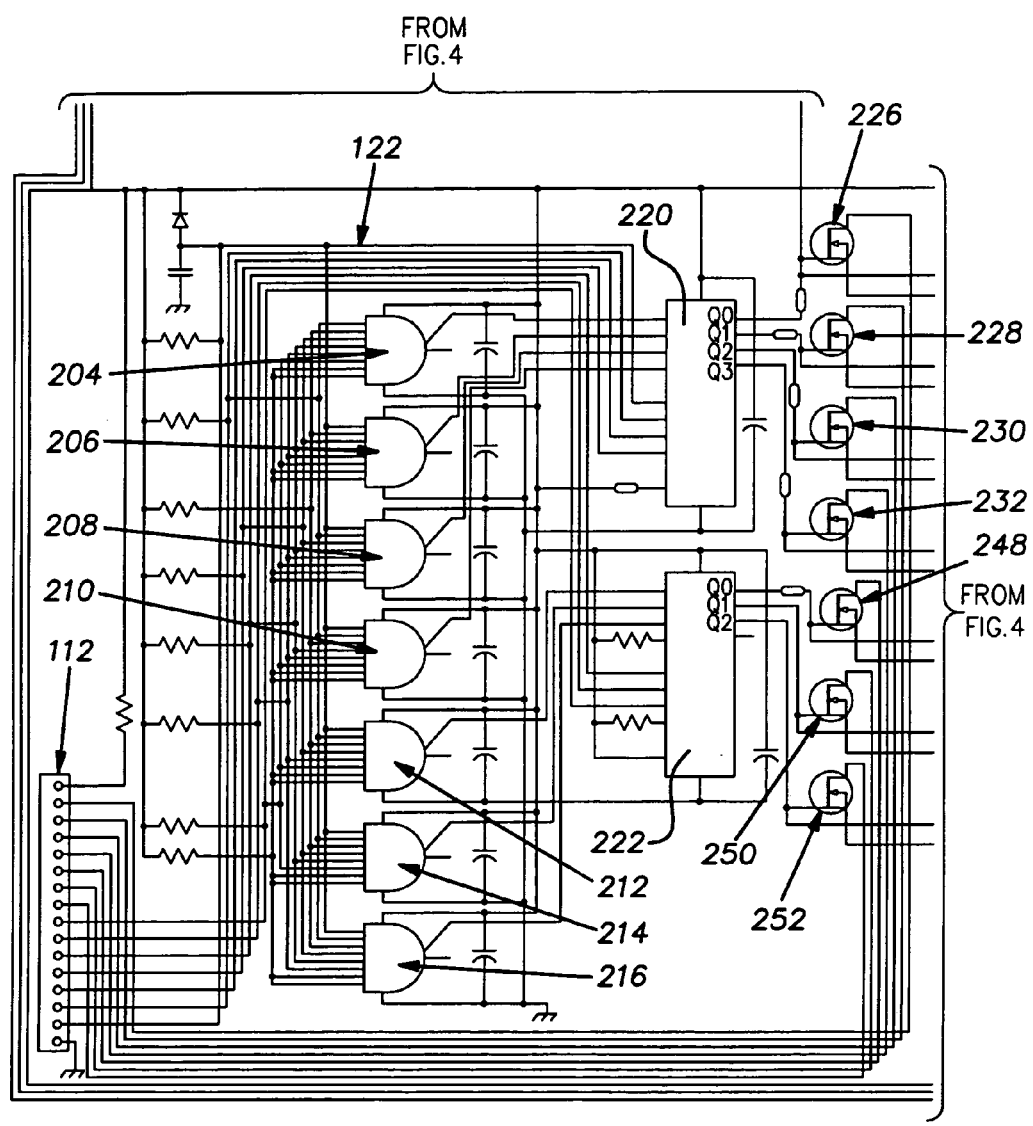
FIG. 5 shows a diagram of a second portion of the proportional solenoid circuit.

With brief reference now to FIGS. 4–5, the 12 VDC output from the voltage regulator 108 is provided to terminal strip 96, which is connected to a terminal strip 112 and thence a terminal strip 114. The terminal strip 114 is connected by a cable (not shown) to the panel terminal strip 64 (shown in FIG. 2) for the shift solenoid valve 12a on the front panel 32.

Referring now to FIG. 2, the panel terminal strip 64 is connected to the contacts of the shift solenoid pushbutton 34a and a phototransistor 118 for lighting the shift solenoid pushbutton 34a. 12 VDC from the voltage regulator 108 is connected across the contacts of the shift solenoid pushbutton 34a such that actuation of the shift solenoid pushbutton 34a closes the contacts and generates a 12 VDC "shift high" signal that is supplied to the phototransistor 118 through the terminal strip 114 in the proportional solenoid circuit 26, thereby lighting the phototransistor 118.

Referring back to FIGS. 3A and 3B, the "shift high" signal is also provided to the coil of the relay 100a in the shift solenoid circuit 24 through the terminal strips 114, 96 in the proportional solenoid circuit 26 and the terminal strip 68 in the shift solenoid circuit 40. In this manner, the actuation of the shift solenoid pushbutton 34a energizes the coil of the relay 100a. Energization of the coil of the relay 100a closes the contacts of the relay 100a, thereby providing the regulated 12 VDC from the voltage regulator 98 to the shift solenoid valve 12a as an actuation signal 120a. The actuation signal 120a is provided to the shift solenoid valve 12a through the terminal strip 102 and the wiring harness 104. It should be appreciated that selective actuation of the shift solenoid pushbuttons 34b–d similarly causes the coils of the relays 100b–d to become energized, respectively, and to close their corresponding contacts, thereby providing regulated 12 VDC power as actuation signals 120b,c,d to the shift solenoid valves 12b–d, respectively. The actuation signals 120a–d have sufficient current to actuate or "pull in" the armatures of the shift solenoid valves 12a–d, respectively, to open (or close) the seats of the shift solenoid valves 12a–d, respectively. Such a pull-in current is typically between 1 and 3 amps and more typically between 1 and 2 amps. The shift solenoid pushbuttons 34a–d may be actuated simultaneously to simultaneously actuate the shift solenoid valves 12a–d.

Referring now to FIGS. 4 and 5, the proportional solenoid circuit 26 for the proportional solenoid valve 14a will be described. Once again, it should be understood that the proportional solenoid circuits 26 for proportional solenoid 14b–d are substantially the same as the proportional solenoid circuit 26 for the proportional solenoid valve 14a. The proportional solenoid circuit 26 comprises a switching section 122 (shown in FIG. 5), a voltage regulating section 124 (shown in FIG. 4) and a current regulating section 126 (shown in FIG. 4). The voltage regulating section 124 and the current regulating section 126 determine the current and voltage of an output signal 128 of the proportional solenoid circuit 26 in response to operation of the switching section 122.

The voltage regulating section 124 and the current regulating section 126 are connected to the output of a voltage regulator 130, which, in turn, is connected to the terminal block 96. The voltage regulator 130 drops and regulates the 18 VDC filtered output of the bridge rectifier 78 so as to produce a regulated 15 VDC output. The output signal 128 of the proportional solenoid circuit 26 is connected to the terminal block 102 in the shift solenoid circuit 24 through the terminal block 96 and the terminal block 86 in the shift solenoid circuit 24.

The voltage regulating section 124 includes a voltage regulator 132, a PNP transistor 134 and an error amplifier 136. The voltage regulator 132 is connected to the output of the voltage regulator 130 and is operable to produce a positive 5 volt reference voltage output. The output from the voltage regulator 132 is connected through a variable resistor 140 to a non-inverting input of the error amplifier 136, which is preferably a portion of a quad operational amplifier, such as is commercially available from Semiconductor Components Industries LLC under the trade name LM324. The variable resistor 140 is operable to adjust the voltage of the output from the error amplifier 136. Resistors 142 and 144 form a voltage divider, which is applied to an inverting input of the error amplifier 136 and which performs output voltage sensing. If the voltage of the output signal 128 is too low, the output of the error amplifier 136 will go positive, thereby applying base current to an NPN transistor 146. As a result, the NPN transistor 146 pulls base current through the PNP transistor 134, which causes the current and, thus, the voltage of the output signal 128 to increase. The output of the error amplifier 136 drives in such a way as to keep the two voltages at its inputs in equilibrium. A stabilizing capacitor 148 is connected into a negative feedback loop of the error amplifier 136 to prevent oscillation.

Preferably, the variable resistor 140 of the voltage regulating section 124 is adjusted to a maximum and the voltage reduction that is necessary to maintain the proper current limiting is managed entirely by the current regulating section 126. The current regulating section 126 includes a low-value precision resistor 150 connected between the negative voltage output from the contacts of a relay 152 and ground. The resistor 150 is used for sensing current. More specifically, the voltage drop across the resistor 150 produces a voltage signal corresponding to the amount of current of the output signal 128. This voltage signal is provided to the display 58 through the terminal strip 114 and the panel terminal strip 64 on the front panel 32. The voltage signal is also provided to a non-inverting input of a current sensing amplifier 156, which is preferably a second portion of the quad operational amplifier. The current sensing amplifier 156 is configured to produce an output voltage gain of ten times the input voltage. The output of the current sensing amplifier 156 is connected to a non-inverting input of a comparator 158, which is preferably a third portion of the quad operational amplifier. An inverting input of the comparator 158 is connected to a voltage regulator 160 through a selected one of a plurality of variable resistors or potentiometers 162, 164, 166, 168, 170, 172 and the potentiometer 56, which function as voltage dividers. The voltage regulator 160 is connected to the output of the voltage regulator 130 and is operable to produce a positive 5 volt reference voltage output. The 5 volt reference voltage from the voltage regulator 160 is reduced to one of a plurality of different voltage values through the selection of one of the potentiometers 162–172 or the potentiometer 56, as will be discussed further below. The reduced voltage values are voltage setpoint values that correspond to current setpoint values. The potentiometers 162–172 are variable resistors that can be adjusted to have different values, and the potentiometer 56 can be manually manipulated to change the resistance of the potentiometer 56. The potentiometers 162–172 are set to produce different preset currents ranging from about 0 to about 1.2 amps.

As long as the non-inverting input voltage stays lower than the inverting input voltage, the output of the comparator 158 stays low. When the current of the output signal 128 rises to a level which causes the non-inverting input to exceed that of the inverting input, the output of the comparator 158 goes high, thereby applying base current to an NPN transistor 174. As a result, the NPN transistor 174 pulls the non-inverting input of the error amplifier 136 to ground, which, in turn, stops the draw of base current through the PNP transistor 134, thereby turning off the output signal 128 until the current of the output signal 128 drops below the current setpoint value determined by the selected one of the potentiometers 162–172 or the potentiometer 56. The rapid switching of the voltage regulating section 124 and the current regulating section 126 holds the voltage of the output signal 128 to a level that, with any given load, maintains the current of the output signal 128 at the current setpoint value. A resistor 178 and a capacitor 180 filter and stabilize the output signal 128, which is provided to the proportional solenoid valve 14a through the output terminal strip 102.

The output of the comparator 158 may be connected to a phototransistor 182 through an amplifier 184 so as to light the phototransistor 182 when the comparator 158 goes high, thereby indicating that current limiting is occurring.

The selection of one of the potentiometers 162–172 or the potentiometer 56 to determine a current setpoint value for the output signal 128 is performed through the switching section 122. The switching section 122 is connected to the proportional solenoid pushbuttons 36–48 on the front panel 32 and is operable in response to manipulation of the proportional solenoid pushbuttons 36–48 to select one of the potentiometers 162–168 or the potentiometer 56 and, thus, a current setpoint value. The switching section 122 is connected to the panel terminal strip 66 on the front panel 32 through a cable (not shown) connected between the panel terminal strip 66 and the terminal strip 112 in the proportional solenoid circuit 26. As shown in FIG. 2, the panel terminal strip 66 is connected to contacts and phototransistors 188, 190, 192, 194, 196, 198, 200 of the proportional solenoid pushbuttons 36–48 for the proportional solenoid valve 14a.

The switching section 122 includes seven AND gates 204, 206, 208, 210, 212, 214, 216 associated with the seven proportional solenoid pushbuttons 36, 38, 40, 42, 44, 46, 48, respectively. The AND gates 204–216 are connected to the proportional solenoid pushbuttons 36–48 through the terminal strip 112 such that the inputs of each AND gate are connected to all of the proportional solenoid pushbuttons, except the proportional solenoid pushbutton with which the AND gate is associated. Thus, for example, the excepted proportional solenoid pushbutton for the AND gate 204 is the proportional solenoid pushbutton 36. The proportional solenoid pushbuttons 36–48 and the AND gates 204–216 are interconnected with the 12 VDC from the voltage regulator 108 and ground such that the actuation of a proportional solenoid pushbutton will pull the inputs of the AND gates to which the proportional solenoid pushbutton are connected to ground or "low" states. Thus, the actuation of a proportional solenoid pushbutton will create "low" outputs for all of the AND gates, except for the AND gate that is not connected to the proportional solenoid pushbutton (i.e., the AND gate associated with the proportional solenoid pushbutton), which will be "high". Thus, actuation of a proportional solenoid pushbutton will result in the AND gate associated with the proportional solenoid having a high output and all of the other AND gates having low outputs.

The outputs of the AND gates 204–216 are connected to a pair of R/S latch circuits 220, 222, each of which is a cross-coupled 3-state CMOS NAND latch circuit having four latches. The latches (R, S) of the R/S latch circuit 220 are associated with the proportional solenoid pushbuttons 36, 38, 40, 42, respectively, while the latches of the R/S latch circuit 222 are associated with the proportional solenoid pushbuttons, respectively 44, 46, 48. For each proportional solenoid pushbutton and its associated latch, the set input (S) of the latch is connected to the proportional solenoid pushbutton and the reset input (R) of the latch is connected to the AND gate associated with the proportional solenoid pushbutton. Each latch is configured such that when the reset input is high and the set input is low, the output of the latch is high, and when the reset input is low and the set input is high, the output of the latch is low. Thus, the actuation of a proportional solenoid pushbutton will result in the output of the latch associated with the proportional solenoid pushbutton going high.

The outputs Q0, Q1, Q2, Q3 of the latches of the R/S latch circuit 220 are connected to the gates of N-channel DMOSFETs 226, 228, 230, 232, respectively, and to the gates of N-channel DMOSFETs 234, 236, 238, 240, respectively. In addition, the output Q0 of the R/S latch circuit 220 is connected to the N-channel DMOSFET 244 (shown in FIG. 4). The outputs Q0, Q1, Q2 of the latches of the R/S latch circuit 222 are connected to the gates of N-channel DMOSFETs 248, 250, 252, respectively, and to the gates of N-channel DMOSFETs 254, 256, 258, respectively. The drains of the N-channel DMOSFETs 226, 228, 230, 232, 248, 250, 252 are connected to the phototransistors 188, 190, 192, 194, 196, 198 200 of the proportional solenoid pushbuttons 36–48, respectively, through the terminal strip 112 and the panel terminal strip 66 on the front panel 32, whereas the drains of the N-channel DMOSFETs 234, 236, 238, 240, 254, 256, 258 are connected to the coils of relays 260, 262, 264, 266, 268, 270, 272, respectively, which are preferably 1 amp miniature relays with 12 VDC coils. The drain of the N-channel DMOSFET 244 is connected to the coil of the relay 152, which is also preferably a 1 amp miniature relay with a 12 VDC coil. Each phototransistor 188, 190, 192, 194, 196, 198, or 200 and its associated N-channel DMOSFET 226, 228, 230, 232, 248, 250, or 252 are interconnected with the 12 VDC from the voltage regulator 108 and ground such that a "high" signal to the gate of the N-channel DMOSFET causes the N-channel DMOSFET to connect the phototransistor to ground, thereby completing the electrical circuit for the phototransistor and lighting the phototransistor. Similarly, each relay 152, 260, 262, 264, 266, 268, 270, or 272 and its associated N-channel DMOSFET 244, 234, 236, 238, 240, 254, 256, or 258 are interconnected with the 12 VDC from the voltage regulator 108 and ground such that a "high" signal to the gate of the N-channel DMOSFET causes the N-channel DMOSFET to connect the coil of the relay to ground, thereby completing the electrical circuit for the coil and energizing the coil. In this manner, a high signal from the output of a latch of one of the R/S latch circuits 220, or 222, will light the phototransistor(s) associated with the latch and energize the coil(s) of the relay(s) associated with the latch. Contacts of the relay 152 are connected to the negative voltage line of the output signal 128, contacts of the relays 260–270 are connected to the potentiometers 162, 164, 166, 168, 170, 172 of the current regulating section 126, and the contacts of the relay 272 are connected to the potentiometer 56.

The potentiometers 162–172 and the potentiometer 56 are connected to the contacts of the relays 260–272 such that the energization of the coil of one of the relays 260, 262, 264, 266, 268, 270 or 272 will connect one of the potentiometers 162, 164, 166, 168, 170, or 172 or the potentiometer 56 to the inverting input of the comparator 158. More specifically, energization of the coil of the relay 260 will connect the potentiometer 162, energization of the coil of the relay 262 will connect the resistor 164, energization of the coil of the relay 264 will connect the resistor 166, energization of the coil of the relay 266 will connect the resistor 168, energization of the coil of the relay 268 will connect the resistor 170, energization of the coil of the relay 270 will connect the resistor 172 and energization of the coil of the relay 272 will connect the potentiometer 56. Energization of the coil of the relay 152 disconnects the negative voltage line of the output signal 128, thereby turning off the output signal 128, which corresponds to a zero current.

In summary, for each proportional solenoid circuit 26 and its associated row a, b, c, or d of the proportional solenoid pushbuttons 36–48, selective actuation of the proportional solenoid pushbuttons 38–46 provides the output signal 128 of the proportional solenoid circuit 26 with preset currents ranging from above 0 amps to about 1.2 amps; actuation of the proportional solenoid pushbutton 36 provides the output signal 128 of the proportional solenoid circuit 26 with a current of zero amps since the actuation of the proportional solenoid 36 pushbutton energizes the coil of the relay 152; and actuation of the proportional solenoid pushbutton 48 provides the output signal 128 of the proportional solenoid circuit 26 with a variable current that is determined by manual manipulation of the potentiometer 56. The four proportional solenoid circuits 26 may simultaneously provide four output signals 12, respectively, to the proportional solenoid valves 14a–d, respectively, wherein the four output signals 12 have the same or different currents.

Referring back to FIG. 1, the solenoid control module 20 is used to test the operation of the shift solenoid valves 12a–d and the proportional solenoid valves 14a–d in the context of the operation of the transmission valve body 22. The shift solenoid valves 12a–d and the proportional solenoid valves 14a–d are connected to the solenoid control module 20 by the wiring harness 104, while the transmission valve body 22 is hydraulically connected to the valve test stand 18 through a hose network 280. The valve test stand 18 is connected by a hose 282 to the hydraulic fluid source 16 to receive pressurized hydraulic fluid (oil) therefrom. The valve test stand 18 controls the provision of pressurized hydraulic fluid to the transmission valve body 22 and monitors the various outlet pressures of the transmission valve body 22 in response to the provision of the output signals 120a–d, 128 from the solenoid control module 20. The outlet pressures are displayed on gauges 284.

Although the solenoid control module 20 is shown testing a transmission valve body 22 with four shift solenoid valves 12a–d and four proportional solenoid valves 14a–d, it should be appreciated that the solenoid control module 20 can also be used to test other transmission valve bodies having different combinations of shift solenoid valves and proportional solenoid valves. For example, in one particular application, the solenoid control module 20 is used to test a transmission valve body having the four shift solenoid valves 12a–d and only three proportional solenoid valves 14a,b,c.

It should also be appreciated that the solenoid control module 20 is not limited to testing the shift solenoid valves 12a–d and the proportional solenoid valves 14a–d in the context of the operation of the transmission valve body 22. Instead, the solenoid control module 20 can be used to test the shift solenoid valves 12a–d and the proportional solenoid valves 14a–d before they are installed in the transmission valve body 22. In this application, the shift solenoid valves 12a–d and the proportional solenoid valves 14a–d are directly connected by hoses to the valve test stand 18 or other test device for the receipt and discharge of pressurized hydraulic fluid.

It should further be appreciated that the present invention is not limited to testing four or less shift solenoid valves and four or less proportional solenoid valves. Rather, the apparatus and methodology taught by the present invention may be expanded by those skilled in the art so as to be used to test more than four shift solenoid valves and more than four proportional solenoid valves.

While the invention has been shown and described with respect to particular embodiments thereof, those embodiments are for the purpose of illustration rather than limitation, and other variations and modifications of the specific embodiments herein described will be apparent to those skilled in the art, all within the intended spirit and scope of the invention. Accordingly, the invention is not to be limited in scope and effect to the specific embodiments herein described, nor in any other way that is inconsistent with the extent to which the progress in the art has been advanced by the invention.

What is claimed is:

1. An apparatus for testing a proportional solenoid valve of an automotive transmission, said apparatus comprising:
   a plurality of preset current switches; and
   a proportional solenoid circuit electrically connected to the preset current switches and having an output for connection to the proportional solenoid valve, said proportional solenoid circuit being operable in response to selective actuation of the preset current switches to generate and transmit electrical preset current signals to the proportional solenoid valve through the output, respectively, and wherein said preset current signals have different preset current levels.

2. The apparatus of claim 1, wherein the preset current switches are pushbuttons.

3. The apparatus of claim 2, wherein the preset current pushbuttons are momentary pushbuttons.

4. The apparatus of claim 2, further comprising:
   a variable current switch electrically connected to the proportional solenoid circuit;
   a potentiometer for manipulation by an operator, said potentiometer being electrically connected to the proportional solenoid circuit; and
   wherein said proportional solenoid circuit is operable in response to actuation of the variable current switch to generate and transmit an electrical variable current signal to the proportional solenoid valve through the output, said electrical variable current signal having a current level chosen by operator manipulation of the potentiometer.

5. The apparatus of claim 4, wherein the variable current switch is a pushbutton.

6. The apparatus of claim 5, wherein the variable current switch is a momentary pushbutton.

7. The apparatus of claim 5, wherein the apparatus is also operable to test an on/off solenoid valve of an automotive transmission, said apparatus further comprising:
an on/off valve switch; and
an on/off solenoid circuit electrically connected to the on/off valve switch and comprising an output for connection to the on/off solenoid valve, said on/off solenoid circuit being operable to generate an electrical actuation signal for transmission through the output to the on/off solenoid valve in response to actuation of the on/off valve switch.

8. The apparatus of claim 1, wherein the proportional solenoid circuit comprises:
a plurality of resistors associated with the preset current switches, respectively;
a voltage regulator having an output selectively connectable to the resistors such that upon actuation of a selected one of the preset current switches, the output of the voltage regulator is connected to the resistor associated with the selected one of the preset current switches, thereby producing a voltage setpoint signal corresponding to the preset current level for the selected one of the preset current switches;
a current sensing circuit operable to produce a voltage signal corresponding to the current of the preset current signal for the selected one of the preset current switches;
a comparator having an output and having inputs connected to receive the voltage setpoint signal and the voltage signal, respectively, said comparator being operable to generate a high signal as the output when the voltage signal is greater than the voltage setpoint signal; and
a voltage regulating circuit connected to the output of the comparator and operable in response to receiving the high signal to turn off the preset current signal for the selected one of the preset current switches until the current of the preset current signal is below the preset current level for the selected one of the preset current switches.

9. The apparatus of claim 8, wherein the voltage regulating circuit comprises:
a first NPN transistor having a gate connected to the output of the comparator;
a PNP transistor from which the preset current signal for the selected one of the preset current switches is output;
a voltage sensing circuit operable to produce a voltage signal corresponding to the voltage of the preset current signal for the selected one of the preset current switches;
an error amplifier having a non-inverting input connected to the output of the first NPN transistor and an inverting input connected to receive the voltage signal from the voltage sensing circuit; and
a second NPN transistor having a gate connected to the output of the error amplifier and an output connected to a gate of the PNP transistor;
wherein the high signal from the comparator causes the first NPN transistor to pull the non-inverting input of the error amplifier to ground, which causes the output of the error amplifier to go low, which, in turn, stops the second NPN transistor from pulling base current through the PNP, thereby turning off the preset current signal for the selected one of the preset current switches.

10. The apparatus of claim 8, wherein the resistors are variable resistors.

11. The apparatus of claim 1, wherein the apparatus is also operable to test a second proportional solenoid valve, said apparatus further comprising a plurality of second preset current switches, and a second proportional solenoid circuit electrically connected to the second preset current switches and having an output for connection to the second proportional solenoid valve, said second proportional solenoid circuit being operable in response to selective actuation of the second preset current switches to generate and transmit electrical preset current signals to the second proportional solenoid valve through the output, wherein said preset current signals have different preset current levels.

12. The apparatus of claim 11, further comprising:
a second variable current switch electrically connected to the second proportional solenoid circuit;
a second potentiometer for manipulation by an operator, said second potentiometer being electrically connected the second proportional solenoid circuit; and
wherein said second proportional solenoid circuit is operable in response to actuation of the second variable current switch to generate and transmit an electrical variable current signal to the second proportional solenoid valve through the output, said electrical variable current signal having a current level chosen by operator manipulation of the second potentiometer.

13. The apparatus of claim 12, wherein the apparatus is also operable to test third and fourth proportional solenoid valves, said apparatus further comprising:
a plurality of third preset current switches;
a plurality of fourth preset current switches;
a third proportional solenoid circuit electrically connected to the third preset current switches and having an output for connection to the third proportional solenoid valve, said third proportional solenoid circuit being operable in response to selective actuation of the third preset current switches to generate and transmit electrical preset current signals to the third proportional solenoid valve through the output;
a fourth proportional solenoid circuit electrically connected to the fourth preset current switches and having an output for connection to the fourth proportional solenoid valve, said fourth proportional solenoid circuit being operable in response to selective actuation of the fourth preset current switches to generate and transmit electrical preset current signals to the fourth proportional solenoid valve through the output; and
wherein in each of the third and fourth proportional solenoid circuits, the preset current signals have different preset current levels.

14. The apparatus of claim 1, wherein the preset current levels are in a range from 0 to about 1.2 amps.

15. An apparatus for testing an on/off solenoid valve and a proportional solenoid valve of an automotive transmission, said apparatus comprising:
an on/off valve switch;
a plurality of preset current switches;
an on/off solenoid circuit electrically connected to the on/off valve switch and comprising an output for connection to the on/off solenoid valve, said on/off solenoid circuit being operable to generate an electrical actuation signal for transmission through the output to the on/off solenoid valve in response to actuation of the on/off valve switch; and a proportional solenoid circuit electrically connected to the preset current switches and having an output for connection to the proportional solenoid valve, said proportional solenoid circuit being operable in response to selective actuation of the preset current switches to generate and transmit electrical preset current signals to the proportional solenoid valve through the output, wherein said preset current signals have different preset current levels.

16. The apparatus of claim 15, further comprising:
a variable current switch electrically connected to the proportional solenoid circuit;
a potentiometer for manipulation by an operator, said potentiometer being electrically connected to the proportional solenoid circuit; and
wherein said proportional solenoid circuit is operable in response to actuation of the variable current switch to generate and transmit an electrical variable current signal to the proportional solenoid valve through the output, said electrical variable current signal having a current level chosen by operator manipulation of the potentiometer.

17. The apparatus of claim 16, wherein the on/off valve switch, the preset current switches and the variable current switch are all pushbuttons.

18. The apparatus of claim 17, wherein the on/off valve switch is a latching pushbutton and the preset current switches and the variable current switch are momentary pushbuttons.

19. The apparatus of claim 15, wherein the apparatus is also operable to test a second proportional solenoid valve, said apparatus further comprising:
a plurality of second preset current switches;
a second proportional solenoid circuit electrically connected to the second preset current switches and having an output for connection to the second proportional solenoid valve, said second proportional solenoid circuit being operable in response to selective actuation of the second preset current switches to generate and transmit electrical preset current signals to the second proportional solenoid valve through the output, wherein said preset current signals have different preset current levels;
a second variable current switch electrically connected to the second proportional solenoid circuit;
a second potentiometer for manipulation by an operator, said second potentiometer being electrically connected the second proportional solenoid circuit; and
wherein said second proportional solenoid circuit is operable in response to actuation of the second variable current switch to generate and transmit an electrical variable current signal to the second proportional solenoid valve through the output, said electrical variable current signal having a current level chosen by operator manipulation of the second potentiometer.

20. The apparatus of claim 19, wherein the apparatus is also operable to test a second on/off solenoid valve, said apparatus further comprising a second on/off valve switch; and wherein the on/off solenoid circuit is electrically connected to the second on/off valve switch and further comprises a second output for connection to the second on/off solenoid valve, said on/off solenoid circuit being further operable to generate an electrical second actuation signal for transmission through the second output to the second on/off solenoid valve in response to actuation of the second on/off valve switch.

21. The apparatus of claim 15, wherein the actuation signal has sufficient current to actuate the on/off solenoid valve.

22. An apparatus for testing a proportional solenoid valve of an automotive transmission, said apparatus comprising:
a plurality of preset current switches;
a proportional solenoid circuit electrically connected to the preset current switches and having an output for connection to the proportional solenoid valve, said proportional solenoid circuit being operable in response to selective actuation of the preset current switches to generate and transmit electrical preset current signals to the proportional solenoid valve through the output, respectively, and wherein said preset current signals have different preset current levels;
a variable current switch electrically connected to the proportional solenoid circuit;
a potentiometer for manipulation by an operator, said potentiometer being electrically connected to the proportional solenoid circuit; and
wherein said proportional solenoid circuit is operable in response to actuation of the variable current switch to generate and transmit an electrical variable current signal to the proportional solenoid valve through the output, said electrical variable current signal having a current level chosen by operator manipulation of the potentiometer.

23. The apparatus of claim 22, wherein the proportional solenoid circuit comprises:
a plurality of resistors associated with the preset current switches, respectively;
a voltage regulator having an output selectively connectable to the resistors and to the potentiometer such that upon actuation of a selected one of the preset current switches and the variable current switch, the output of the voltage regulator is connected to the resistor or the potentiometer, as the case may be, associated with the selected one of the preset current switches and the potentiometer, thereby producing a voltage setpoint signal corresponding to the preset current level or the chosen current level, as the case may be, for the selected one of the preset current switches and the variable current switch;
a current sensing circuit operable to produce a voltage signal corresponding to the current of the preset current signal or the variable current signal, as the case may be, for the selected one of the preset current switches and the variable current switch;
a comparator having an output and having inputs connected to receive the voltage setpoint signal and the voltage signal, respectively, said comparator being operable to generate a high signal as the output when the voltage signal is greater than the voltage setpoint signal; and
a voltage regulating circuit connected to the output of the comparator and operable in response to receiving the high signal to turn off the preset current signal or the variable current signal, as the case may be, for the selected one of the preset current switches and the variable current switch until the current of the preset current signal or the variable current signal, as the case may be, is below the preset current level or the chosen current level, as the case may be, for the selected one of the preset current switches and the variable current switch.

24. The apparatus of claim 22, wherein the preset current switches and the variable current switch are all momentary pushbuttons.

25. The apparatus of claim 22, wherein the preset current levels and the chosen current level are in a range from 0 to about 1.2 amps.

* * * * *